US007861135B2

(12) United States Patent
Kim et al.

(10) Patent No.: US 7,861,135 B2
(45) Date of Patent: Dec. 28, 2010

(54) LOW-COMPLEXITY AND LOW-POWER-CONSUMPTION TURBO DECODER WITH VARIABLE SCALING FACTOR

(75) Inventors: Byung Jo Kim, Daejeon (KR); Seok Bong Hyun, Daejeon (KR); Seong Su Park, Daejeon (KR); Jae Bum Kim, Daejeon (KR); Hyun Cheol Park, Daejeon (KR); Jong Hyun Seo, Ulsan (KR)

(73) Assignee: Electronics and Telecommunications Research Institute of Daejeon (KR)

( * ) Notice: Subject to any disclaimer, the term of this patent is extended or adjusted under 35 U.S.C. 154(b) by 1000 days.

(21) Appl. No.: 11/701,956

(22) Filed: Feb. 2, 2007

(65) Prior Publication Data

US 2007/0220394 A1    Sep. 20, 2007

(30) Foreign Application Priority Data

Feb. 3, 2006    (KR) ...................... 10-2006-0010694
Jan. 19, 2007   (KR) ...................... 10-2007-0005925
Feb. 2, 2007    (KR) ...................... 10-2007-0010816

(51) Int. Cl.
*H03M 13/00* (2006.01)

(52) U.S. Cl. ........................ 714/755; 714/794; 714/795; 714/796

(58) Field of Classification Search ................ 714/755, 714/794–796; 375/261, 341
See application file for complete search history.

(56) References Cited

U.S. PATENT DOCUMENTS

| 6,145,114 | A  | * | 11/2000 | Crozier et al. ............. 714/794 |
| 6,393,076 | B1 |   | 5/2002  | Dinc et al. |
| 6,526,531 | B1 | * | 2/2003  | Wang ........................ 714/704 |
| 6,885,711 | B2 | * | 4/2005  | Shiu et al. .................. 375/340 |
| 6,888,901 | B2 | * | 5/2005  | Yu et al. .................... 375/341 |
| 6,988,233 | B2 | * | 1/2006  | Kanai et al. ................ 714/755 |
| 7,185,267 | B2 | * | 2/2007  | Koppelaar ................. 714/794 |
| 7,370,332 | B2 | * | 5/2008  | Kutz et al. ................. 714/780 |
| 7,376,209 | B2 | * | 5/2008  | Namgoong et al. ......... 375/341 |
| 7,602,838 | B2 | * | 10/2009 | Bottomley et al. .......... 375/148 |

FOREIGN PATENT DOCUMENTS

| KR | 1020030002676 | 1/2003 |
| KR | 1020030056053 | 7/2003 |
| KR | 2004-0096355  | 11/2004 |

(Continued)

OTHER PUBLICATIONS

Jaebum Kim, et al; "Modified EMLMAP Algorithm using Variable Scaling Factor for Low-power Turbo Decoder;" *International Symposium on Information Theory and its Applications* (*ISITA* 2006), Seoul, Korea, Oct. 2006.

(Continued)

*Primary Examiner*—Esaw T Abraham
(74) *Attorney, Agent, or Firm*—Ladas & Parry LLP

(57) ABSTRACT

Provided is a turbo decoder with a variable scaling factor. The decoding convergence degree of the turbo decoder is evaluated using a sign difference ratio (SDR) value, the iterative-decoding number is limited, a variable scaling factor is calculated and applied in each decoding convergence area based on the SDR value, and the average number of decoding iterations is reduced.

7 Claims, 4 Drawing Sheets

FOREIGN PATENT DOCUMENTS

| | | |
|---|---|---|
| KR | 1020050079986 | 8/2005 |
| KR | 2006-0005760 | 1/2006 |
| WO | WO03/003586 | 1/2003 |

OTHER PUBLICATIONS

Jaebum Kim, et al: "A Modified EMLMAP Algorithm using Variable Scaling Factor;" *Korea Information and Communications Society Autumn Conference*, Nov. 2006, vol. 24.

Ken Gracie, et al "Performance of an MLSE-Based Early Stopping Techniquie for Turbo Codes;" *IEEE*, 2004.

J. Vogt, et al; "Improving the max-log-MAP turbo decoder;" *Electronic Letters*, Nov. 9, 2000, vol. 36, No. 23.

Stephan ten Brink; "Convergence Behavior of Iteratively Decoded Parellel Concatenated Codes;" *IEEE*, 2001.

* cited by examiner

LOW-COMPLEXITY AND LOW-POWER-CONSUMPTION TURBO DECODER WITH VARIABLE SCALING FACTOR

CROSS-REFERENCE TO RELATED APPLICATION

This application claims priority to and the benefit of Korean Patent Application Nos. 10-2006-10694, filed Feb. 3, 2006, 10-2007-5925, filed Jan. 19, 2007 and 10-2007-10816, filed Feb. 2, 2007, the disclosure of which is incorporated herein by reference in its entirety.

BACKGROUND

1. Field of the Invention

The present invention relates to a low-complexity and low-power-consumption turbo decoder with a variable scaling factor, and more particularly, to a low-complexity and low-power-consumption turbo decoder in which performance of the turbo decoder is enhanced by applying a variable scaling factor producing optimal performance in each decoding convergence area using a sign difference ratio (SDR) and limiting an iterative-decoding number, and power consumption is reduced by reducing the average number of decoding iterations.

2. Discussion of Related Art

As mobile communications services including multimedia services such as video, wireless Internet, and the like are provided, low bit error rate (BER) performance as well as high-speed transmission are required. Research for error correction schemes and performance enhancement is being actively performed. At present, turbo codes have been adopted as error correction codes for next-generation mobile communications systems such as High Speed Downlink Packet Access (HSDPA), WiBro, and the like.

FIGS. 1A and 1B illustrate a conventional turbo decoder for decoding turbo codes. Referring to FIG. 1A, a conventional turbo decoder comprises two component decoders 110 and 130 in series. The component decoders 110 and 130 perform iterative decoding while exchanging extrinsic information generated. The component decoders 110 and 130 employ decoding algorithms, such as a Log-MAP (LMAP) algorithm, a Max-Log-MAP (MLMAP) algorithm, and the like.

The LMAP algorithm is a version of Maximum A Posteriori (MAP) algorithm that is implemented on a log domain, which is an optimal algorithm for decoding an information word on a trellis. The MLMAP algorithm is a version of the LMAP algorithm, however the MLMAP algorithm is more simply implemented than the LMAP algorithm through approximation in a metric operation process.

In particular, the MLMAP algorithm reduces complexity and decoding delay of probability-based iterative decoding and is easily implemented, unlike the LMAP algorithm. However, in case that the receiver can recognize an exact signal-to-noise ratio, the decoding performance of the MLMAP algorithm becomes worse, compared to that of the LMAP algorithm.

To address the performance degradation of the MLMAP algorithm, an Enhanced Max-Log-MAP (EMLMAP) algorithm has been suggested in which an output of each of the component decoders 110 and 130 is multiplied by a fixed scaling factor α for iterative decoding, as shown in FIG. 1B.

When an encoded block is relatively small, the decoding performance of the EMLMAP algorithm becomes substantially similar to that of the LMAP algorithm. However, when the encoded block is large, the decoding performance of the EMLMAP algorithm becomes worse, compared to that of the LMAP algorithm.

For a turbo decoder with the EMLMAP algorithm, as an iterative-decoding number increases, a bit error rate and a frame error rate decrease with gradually reduced enhancement. Therefore, after the turbo codes reach their performance limit, the iterative decoding process only incurs additional operation and decoding delay.

In the turbo decoder, a time point to stop iterative decoding with decoding performance unchanged determines power consumption and a decoding-induced time delay. There is a need for a simple means capable of limiting an iterative-decoding number using a simply set threshold value.

SUMMARY OF THE INVENTION

The present invention is directed to a low-complexity and low-power-consumption turbo decoder in which performance of the turbo decoder is enhanced by applying a variable scaling factor producing optimal performance in each decoding convergence area using a sign difference ratio (SDR) and limiting an iterative-decoding number, and power consumption is reduced by reducing the average number of decoding iterations.

One aspect of the present invention provides a low-complexity and low-power-consumption turbo decoder with a variable scaling factor, comprising first and second component decoders for performing iterative decoding on bits encoded with turbo codes based on the variable scaling factor; an early-stop determining unit for checking a sign difference ratio (SDR) value and variably limiting an iterative-decoding number according to the SDR value; and a variable scaling factor calculating unit for calculating the variable scaling factor in each decoding convergence area based on the SDR value.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present inven- FIG. 2 illustrates a configuration of a low complexity and low-power-consumption turbo decoder with a variable scaling factor according to the present invention.

Figure 1A:
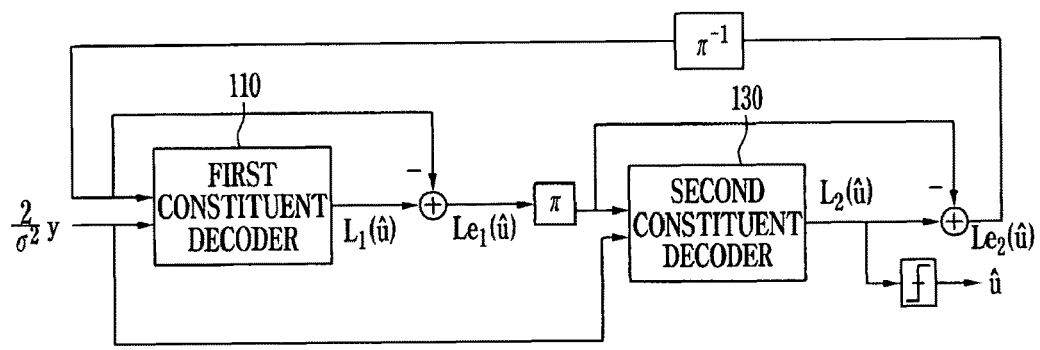
FIGS. 1A and 1B illustrate a configuration of a conventional turbo decoders.
Figure 1B:
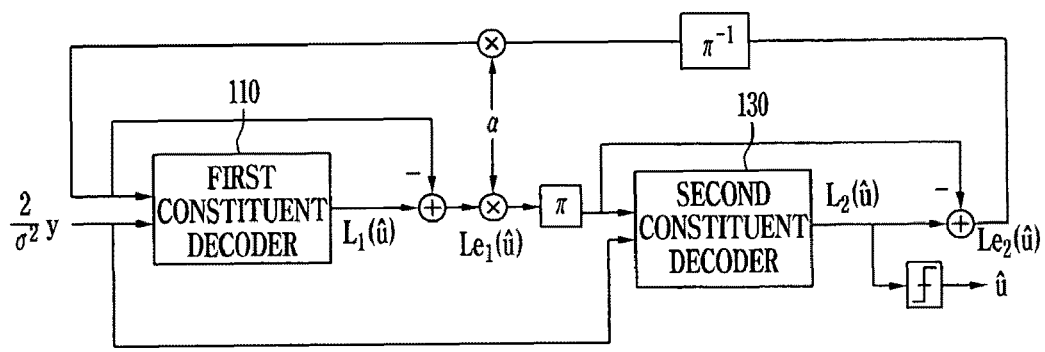
Figure 2:
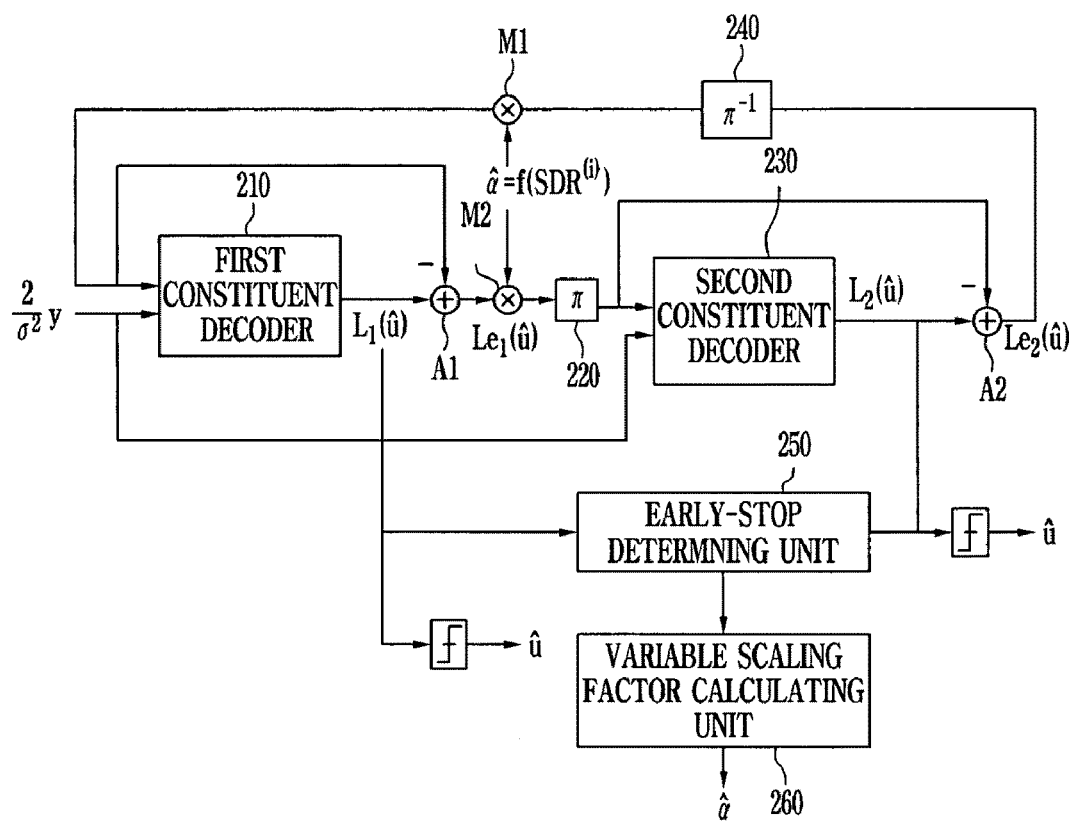
FIG. 2 illustrates a configuration of a low complexity and low-power-consumption turbo decoder with a variable scaling factor according to the present invention.

Referring to FIG. 2, the turbo decoder according to the present invention includes first and second component decoders 210 and 230 for performing iterative decoding on bits encoded with turbo codes according to a variable scaling factor; an interleaver 220 for matching an order of a bit string between the first and second component decoders 210 and 230; a de-interleaver 240 for rearranging information rearranged by the interleaver 220, in the same order of original information bits; first and second adders A1 and A2 for adding input valued of the first and second component decoders 210 and 230 to output values thereof to generate new extrinsic information to be used as an input value of the subsequent component decoder; first and second multipliers M1 and M2 for multiplying the new extrinsic information by the variable scaling factor $\hat{\alpha}$; an early-stop determining unit 250 for checking a sign difference ratio (SDR) value and variably limiting an iterative-decoding number according to the SDR value; and a variable scaling factor calculating unit 260 for calculating a variable scaling factor exhibit optimal performance in each decoding convergence area based on the SDR value.

The first and second component decoders 210 and 230 perform iterative decoding while exchanging extrinsic information using an EMLMAP algorithm to generate and output log-likelihood ratios (LLRs), $L_1(\hat{u})$ and $L_2(\hat{u})$. For iterative decoding, the inputs of the component decoders 210 and 230 are multiplied by a variable scaling factor $\hat{\alpha}$ through the multipliers M1 and M2.

The early-stop determining unit 250 measures an SDR of the outputs $L_1(\hat{u})$ and $L_2(\hat{u})$ of the first and second component decoders 210 and 230. The early-stop determining unit 250 functions to immediately stop iterative decoding when the SDR value is '0', and to continuously perform iterative decoding when the SDR value is not '0'.

According to the present invention, the performance of the low-complexity turbo decoder can be enhanced by applying the variable scaling factor $\hat{\alpha}$ producing optimal performance in each decoding convergence area using the SDR and limiting the iterative-decoding number, and power consumption can be reduced by reducing the average number of decoding iterations. The application of the variable scaling factor $\alpha$ according to the present invention will now be described in greater detail.

Figure 3:
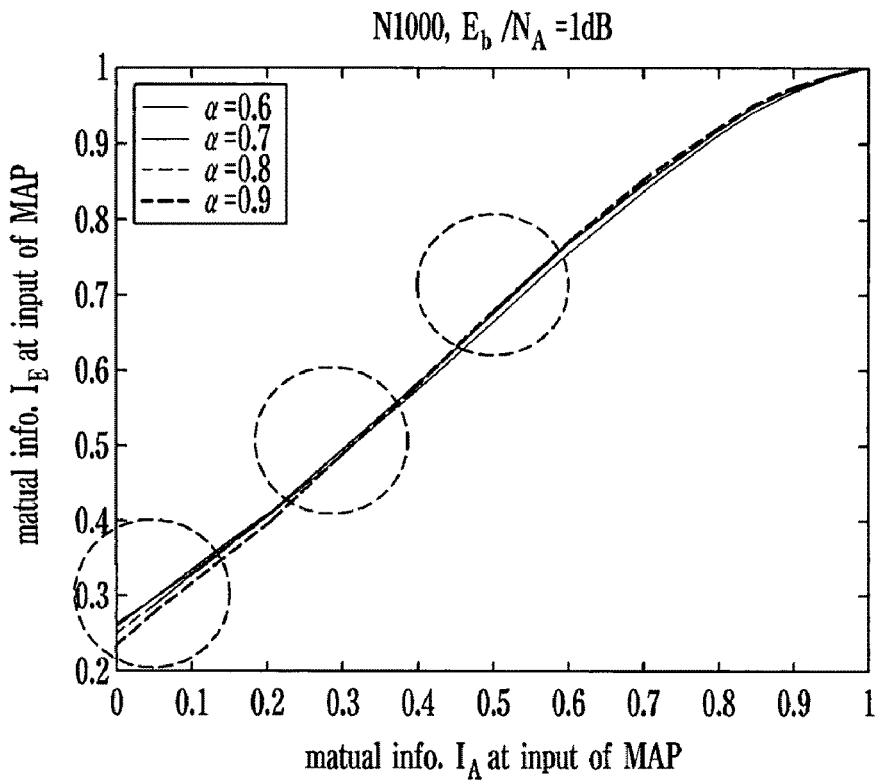
FIG. 3 illustrates an EXIT chart of an EMLMAP algorithm dependent on a scaling factor ranging from 0.6 to 0.9.

First, the decoding convergence performance of the EMLMAP algorithm is analyzed using an Extrinsic Information Transfer (EXIT) chart, which is used as a tool for analyzing convergence behavior of iterative decoding in the turbo decoder and a scaling factor $\alpha$ ranges from 0.6 to 0.9. It can be seen from FIG. 3 that there is a difference in the scaling factor $\hat{\alpha}$ producing optimal performance between the decoding convergence areas.

EXIT chart is a graph showing a relationship between mutual information $I_A(=H(X;L_A))$ and mutual information $I_E(=H(X;L_E))$, where $L_A$ indicates Priori LLR input to the turbo decoder, X indicates an information block, and $L_E$ indicates extrinsic LLR output from the turbo decoder. On the EXIT chart, the upper curve represents excellent decoding convergence performance of the turbo decoder.

It can be seen that when $I_A$ ranges from 0 to 0.1, a turbo decoder having a scaling factor $\alpha$ of 0.6 produces the most excellent performance; when $I_A$ ranges from 0 to 0.3, a turbo decoder having a scaling factor $\alpha$ of 0.7 produces the most excellent performance, when $I_A$ ranges from 0.3 to 0.55, a turbo decoder having a scaling factor $\alpha$ of 0.8 produces the most excellent performance, and when $I_A$ ranges from 0.55 to 1, a turbo decoder having a scaling factor $\alpha$ of 0.9 produces the most excellent performance.

Figure 4:
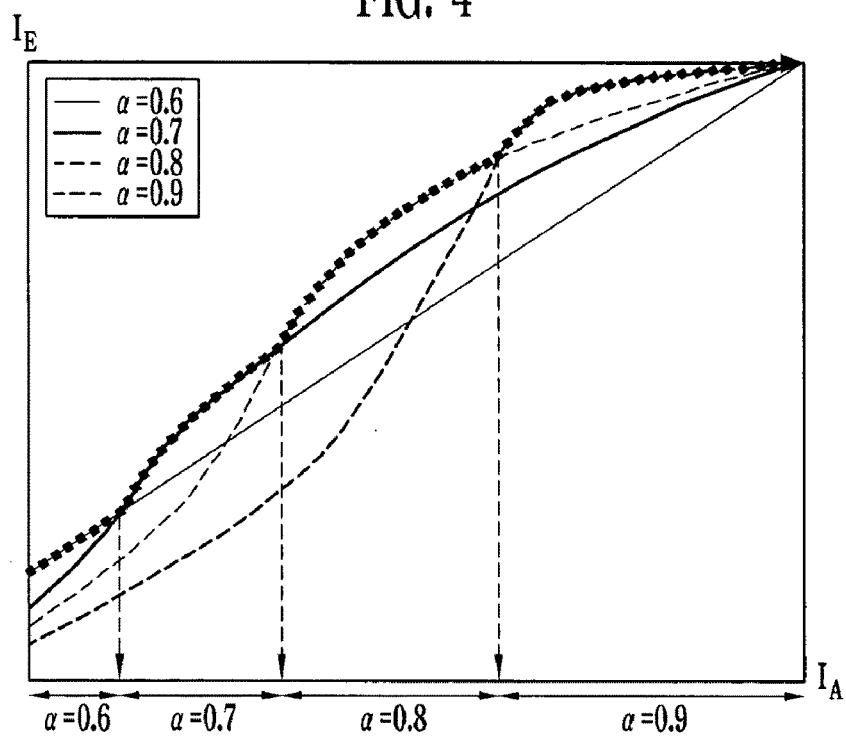
FIG. 4 diagrammatically illustrates decoding performance of an EMLMAP algorithm dependent on a scaling factor of FIG. 2.

The decoding performance of the EMLMAP algorithm dependent on the scaling factor is diagrammatically shown in FIG. 4.

As shown in FIG. 4, there is a scaling factor $\alpha$ producing the optimal performance in each decoding convergence area. If the turbo decoder evaluates the IA value, the performance of the EMLMAP algorithm can be optimized by variously applying the scaling factor $\alpha$, which is expressed by $\alpha=f(I_A)$.

However, because the turbo decoder cannot actually derive the mutual information $I_A$ between the input Priori LLR($L_A$) and the information block X, information other than $I_A$ is required for evaluating a decoding convergence degree so that the scaling factor producing the optimal performance in each decoding convergence area can be applied in a variety of ways.

Accordingly, the early-stop determining unit 250 of the present invention measures the SDR value to evaluate the decoding convergence degree of the turbo decoder, and the variable scaling factor calculating unit 260 calculates a variable scaling factor $\hat{\alpha}$ producing optimal performance in each decoding convergence area based on the SDR value.

Specifically, average ratios of the SDRs corresponding to boundary points between scaling factor values to the size N of an encoded block are obtained as 0.109, 0.0547, and 0.0183 through a computer simulation when the scaling factor values are 0.6, 0.7, 0.8, and 0.9. Accordingly, the variable scaling factor $\hat{\alpha}$ producing optimal performance in each decoding convergence area may be expressed by Equation 1.

If $(SDR < N \cdot 0.109)\hat{\alpha}=0.6$, if $(N \cdot 0.0547 \leq SDR < N \cdot 0.109)\hat{\alpha}=0.7$, if $(N \cdot 0.0183 \leq SDR < N \cdot 0.0547)\hat{\alpha}=0.8$, and if $(SDR < N \cdot 0.0183)\hat{\alpha}=0.9$,  Equation 1 where N indicates the size of the encoded block, $\hat{\alpha}$ indicates the variable scaling factor, and SDR indicates the sign difference ratio.

When the early-stop determining unit 250 measures the SDR value, the variable scaling factor calculating unit 270 applies the measured SDR value to a variable scaling factor function $\hat{\alpha}=f(SDR^{(i)})$ such as Equation 1 to obtain a variable scaling factor $\hat{\alpha}$ producing optimal performance in a relevant area, and multiplies the inputs of the component decoders 210 and 230 by the variable scaling factor $\hat{\alpha}$ for iterative decoding. This shortens a decoding time in the iterative decoding scheme and minimizes power consumption upon decoding, thereby optimizing the performance of the low-complexity EMLMAP algorithm.

Simulation

Figure 5:
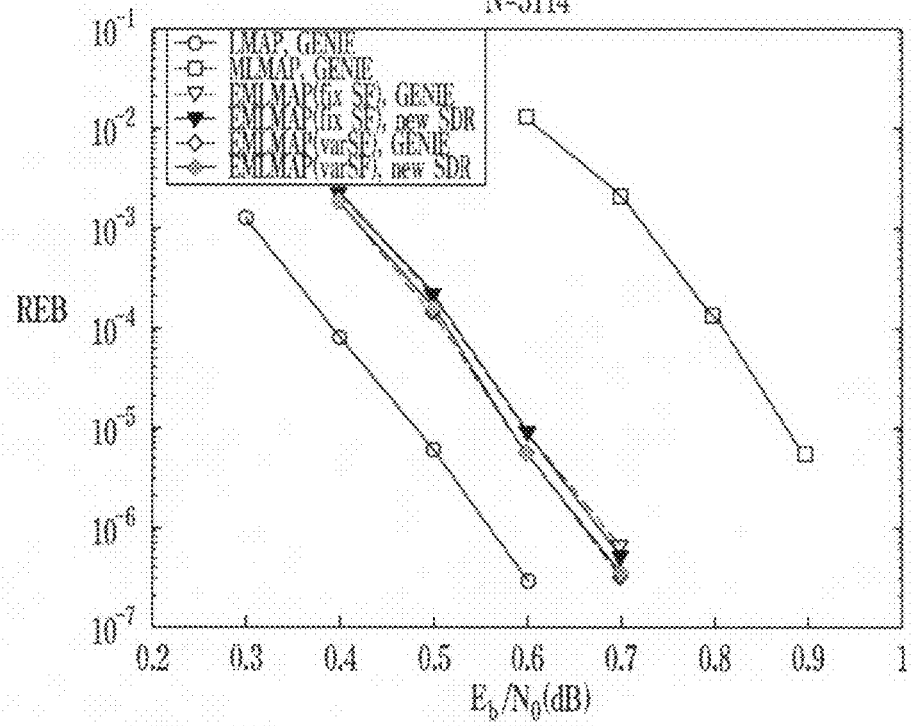
FIG. 5 illustrates a graph showing a comparison of BER performance between a turbo decoder of the present invention and a conventional turbo decoder when N=5114 and R=⅓.
Figure 6:
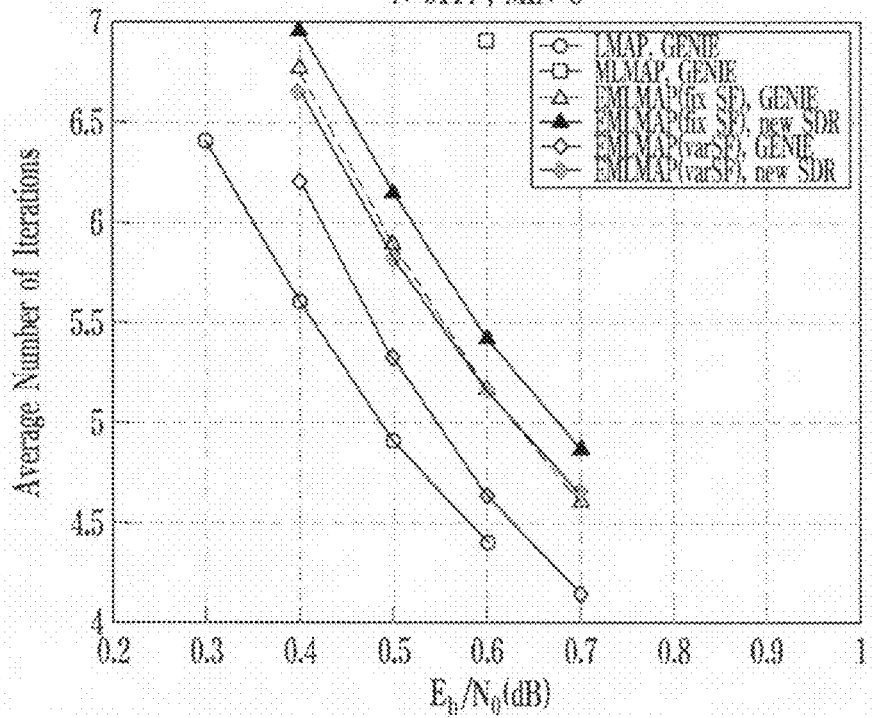
FIG. 6 illustrates a graph showing a comparison of an average number of decoding iterations between the turbo decoder of the present invention and a conventional turbo decoder when N=5114 and R=⅓.

The result of computer simulations to compare efficiency of the turbo decoder of the present invention with that of a conventional turbo decoder and to analyze the efficiencies is shown in FIGS. 5 and 6.

To evaluate efficiency of the turbo decoders in terms of low power consumption in the computer simulation, the turbo decoders are applied to the WCDMA system for analysis of BER performance and average iterative decoding. For the computer simulation, a Binary Phase Shift Keying (BPSK) modulation scheme was utilized in an Additive White Gaussian Noise (AWGN) channel, and a maximum iterative-decoding number of the turbo decoder was set to eight times.

Referring to FIG. 5, a comparison of the BER performance between the turbo decoder of the present invention and the conventional turbo decoder is shown, in which N=5114 and R=⅓. The turbo decoder of the present invention, to which the early-stop algorithm using an SDR and the enhanced EMLMAP algorithm using a variable scaling factor are applied, produces a BER performance of a curve indicated by lozenges while the conventional turbo decoder, to which the EMLMAP algorithm using a fixed scaling factor is applied, produces the BER performance of a curve indicated by triangles. It can be seen that the turbo decoder of the present invention produces a more excellent BER performance than the conventional turbo decoder.

In other words, unlike the conventional turbo decoder, the turbo decoder of the present invention can overcome the shortcoming of a conventional EMLMAP algorithm, i.e., prevent the performance degradation when the size N of the encoded block is great.

It can be seen from FIG. 6 that the average number of decoding iterations of the turbo decoder of the present invention (see curve indicated by lozenges) is about 0.3 times less than that of the conventional turbo decoder. The average number of decoding iterations of the turbo decoder of the present invention is similar to an average number of decoding iterations in a GENIE mode, which may be a lower limit of the average number of decoding iterations of the conventional turbo decoder.

In other words, the turbo decoder of the present invention produces the same performance as the conventional turbo decoder only with about 0.3 times less the average number of decoding iterations than the conventional turbo decoder. Accordingly, the turbo decoder of the present invention performs 0.3 times less iterative decoding than the conventional turbo decoder, thereby reducing power consumption.

As described above, according to the present invention, the decoding convergence degree of the turbo decoder is evaluated using the SDR value and a resultant optimal variable scaling factor is applied, such that the turbo decoder of the present invention can optimize the performance of the EMLMAP algorithm, unlike a conventional turbo decoder with a fixed scaling factor. Thus, the performance degradation when the encoded block is large, which is a shortcoming of a conventional EMLMAP algorithm, can be prevented.

Furthermore, the average number of decoding iterations in the turbo decoder and accordingly the power consumption can be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A low-complexity and low-power-consumption turbo decoder with a variable scaling factor, comprising:
   first and second component decoders for performing iterative decoding on bits encoded with turbo codes according to the variable scaling factor;
   an early-stop determining unit for checking a sign difference ratio (SDR) value and variably limiting an iterative-decoding number based on the SDR value; and
   a variable scaling factor calculating unit for calculating the variable scaling factor in each decoding convergence area based on the SDR value.

2. The turbo decoder of claim 1, wherein the first and second component decoders perform the iterative decoding while exchanging extrinsic information through an Enhanced Max-Log-MAP (EMLMAP) algorithm.

3. The turbo decoder of claim 1, wherein the early-stop determining unit measures the SDR value from outputs of the first and second component decoders, and stops the iterative decoding when the SDR value is '0' and continuously performs the iterative decoding when the SDR value is not '0.'

4. The turbo decoder of claim 1, wherein the variable scaling factor $\hat{\alpha}$ is calculated on the basis that:

if $(SDR < N \cdot 0.109), \hat{\alpha}=0.6$, if $(N \cdot 0.0547 \leq SDR < N \cdot 0.109), \hat{\alpha}=0.7$, if $(N \cdot 0.0183 \leq SDR < N \cdot 0.0547), \hat{\alpha}=0.8$, and if $(SDR < N \cdot 0.0183), \hat{\alpha}=0.9$, where N indicates a size of an encoded block ratio.

5. The turbo decoder of claim 1, further comprising:
   an interleaver for matching an order of a bit string between the first and second component decoders; and
   a de-interleaver for rearranging information rearranged by the interleaver, in the same order of original information bits.

6. The turbo decoder of claim 2, further comprising first and second adders for adding input values of the first and second component decoders to output values thereof to generate new extrinsic information.

7. The turbo decoder of claim 6, further comprising first and second multipliers for multiplying the new extrinsic information by the variable scaling factor.

* * * * *